(12) United States Patent
Kiuru

(10) Patent No.: US 7,193,216 B2
(45) Date of Patent: Mar. 20, 2007

(54) METHOD AND CIRCUIT ARRANGEMENT FOR COMPENSATING FOR RATE DEPENDENT CHANGE OF CONVERSION FACTOR IN A DRIFT-TYPE RADIATION DETECTOR AND A DETECTOR APPLIANCE

(75) Inventor: Erkki Sakari Kiuru, Espoo (FI)

(73) Assignee: Oxford Instruments Analytical Oy, Espoo (FI)

( * ) Notice: Subject to any disclaimer, the term of this patent is extended or adjusted under 35 U.S.C. 154(b) by 273 days.

(21) Appl. No.: 10/971,208

(22) Filed: Oct. 22, 2004

(65) Prior Publication Data

US 2006/0086906 A1    Apr. 27, 2006

(51) Int. Cl.
*G01T 1/24*    (2006.01)
(52) U.S. Cl. .................................. 250/370.01
(58) Field of Classification Search ............ 250/370.01
See application file for complete search history.

(56) References Cited

U.S. PATENT DOCUMENTS 3,968,361 A    7/1976  Bumgardner et al.

FOREIGN PATENT DOCUMENTS

EP    0301963 A2    2/1989

OTHER PUBLICATIONS

Carlo Fiorini, "A Charge Sensitive Preamplifier for High Peak Stability in Spectroscopic Measurements at High Counting Rates." Oct. 16-22, 2004, Nuclear Science Symposium Conference Record, 2004 IEEE, vol. 1, pp. 39-42.*
Marco Sampietro, Chiara Guazzoni, Hermes Cruciata, and Peter Lardner, "Experimental Behavior of a Two-Chip Charge Amplifier for High-Stability Spectroscopy Systems." Aug. 2001, IEEE Transactions on Nuclear Science, vol. 48, No. 4, pp. 1229-1233.*
C. Guazzoni, M. Sampietro, A. Fazzi, P. Lechner, "Two-chip charge amplifier system for high resolution, high count rate readout." Feb. 1, 2001, Nuclear Instruments and Methods in Physics Research A, vol. 458, No. 1-2, pp. 370-374.*
Bertuccio G et al: "Silicon drift detector with integrated p-JFET for continuous discharge of collected electrons through the gate junction" Nuclear Instruments & Methods in Physics Research, Section—A: Accelerators, Spectrometers, Detectors and Associated Equipment, Elsevier, Amsterdam, NL, vol. 377, No. 2, Aug. 1, 1996, pp. 352-356.
Labanti C et al: "ICARUS-SDD: a 16 channel ASIC for silicon drift detectors read-out" Nuclear Instruments & Methods in Physics Research, Section—A: Accelerators, Spectrometers, Detectors and Associated Equipment, Elsvier, Amsterdam, NL, vol. 504, No. 1-3, May 21, 2003, pp. 304-306.
Lechner P et al: "Silicon drift detectors for high resolution room temperature X-ray spectroscopy" Nuclear Instruments & Methods in Physics Research, Section- A: Accelerators, Spectrometers, Detectors and Associated Equipment, Elsevier, Amsterdam, NL, vol. 377, No. 2, Aug. 1, 1996, pp. 346-351.
Castoldi A et al: "Low-noise slew-rate free voltage preamplifier with current-limited continuous reset" Nuclear Instruments &Methods in Physics Research, Section—A: Accelerators, Spectrometers; Detectors and Associated Equipment, Elsevier, Amsterdam, NL, vol. 512, No. 1-2, Oct. 11, 2003, pp. 143-149.
Fiorini et al, "Continuous Charge Restoration in Semiconductor Detectors by Means of the Gate-to-Drain Current of the Integrated Front-End JFET," IEEE Transactions on Nuclear Science, vol. 46, No. 3, Jun. 1999, pp. 761-764.
Elaid, E., "Drain Feedback—A Novel Feedback Technique for Low-Noise Cryogenic Preamplifiers," ORTEC, Inc., Oak Rige, Tennessee, undated, pp. 403-411.

* cited by examiner

*Primary Examiner*—Constantine Hannaher
(74) *Attorney, Agent, or Firm*—Wood, Phillips, Katz, Clark & Mortimer (57) ABSTRACT

For compensating for the rate dependent change of charge-to-voltage conversion factor in a drift-type radiation detector there is detected a change in a momentary photon hit rate affecting said drift-type radiation detector. A drain current flowing through an integrated amplifier of said drift-type radiation detector is changed by an amount proportional to the detected change in said momentary photon hit rate.

11 Claims, 5 Drawing Sheets

METHOD AND CIRCUIT ARRANGEMENT FOR COMPENSATING FOR RATE DEPENDENT CHANGE OF CONVERSION FACTOR IN A DRIFT-TYPE RADIATION DETECTOR AND A DETECTOR APPLIANCE

TECHNICAL FIELD

The invention concerns generally the technology of solid-state detectors for electromagnetic radiation. Especially the invention concerns a way of compensating for the shifting of peak positions as a rate of photon count rate in a drift-type detector used e.g. to detect X-rays.

BACKGROUND OF THE INVENTION

A traditional solid-state detector type to be used for X-ray detection in e.g. imaging and spectroscopy applications is the PIN detector. There the detecting element is a reverse biased PIN diode, one electrode of which is coupled to the gate of a FET (field-effect transistor). X-ray photons that hit the PIN diode cause a photoelectric effect, creating a number of free electrons and holes in a depleted region formed in the semiconductor material. The bias voltage across the PIN diode causes the mobile charge carriers to be drawn to the electrodes, which changes electrode potential. An integrator coupled to the FET transforms the change of the PIN diode's electrode potential into a corresponding change in a voltage across a feedback capacitor.

Figure 1:
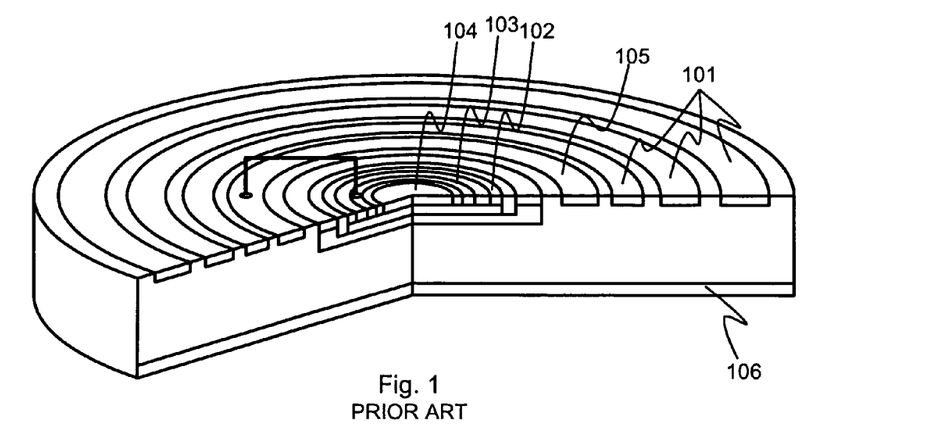
FIG. 1 illustrates the known structure of a SDD chip.

A drift detector is a more advanced detector type, which has been described in detail for example in the publication C. Fiorini, P. Lechner: "Continuous Charge Restoration in Semiconductor Detectors by Means of the Gate-to-Drain Current of the Integrated Front-End JFET", IEEE Trans. on Nucl. Sci., vol. 46, No. 3, June 1999, pp. 761–764. The solid-state semiconductor detector element of drift type detectors is most commonly made of silicon, for which reason these detectors are very commonly referred to as SDDs (Silicon Drift Detectors). An SDD, a partially cut-out example of which is illustrated in FIG. 1, differs from a conventional silicon-based PIN diode detector in that it has a field electrode arrangement comprising the so-called drift rings 101 and an amplifier integrated with the diode component. The amplifier is most typically a FET (Field-Effect Transistor), the source, gate and drain electrodes appear in FIG. 1 as 102, 103 and 104 respectively. The anode and cathode of the detector diode are illustrated as 105 and 106 respectively in FIG. 1.

Figure 2:
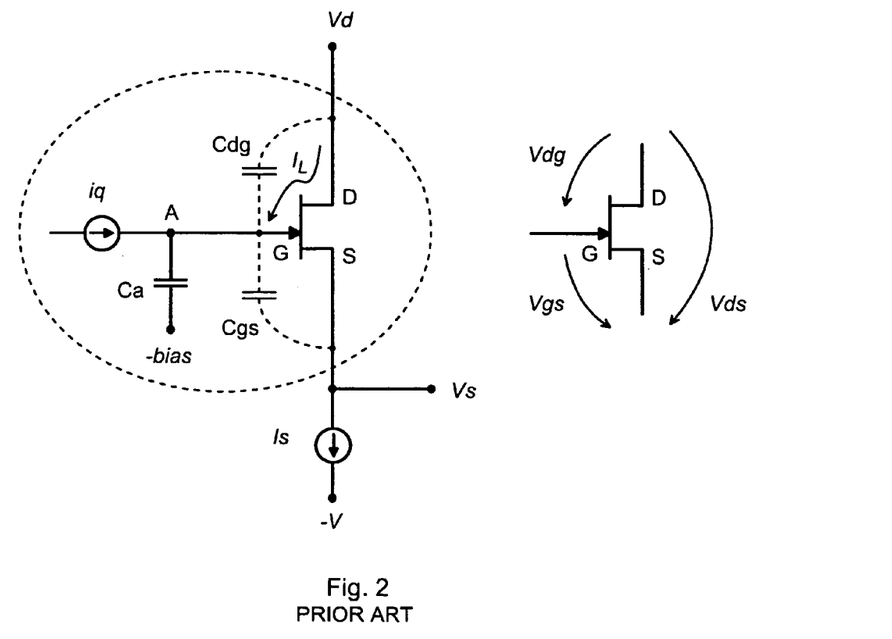
FIG. 2 illustrates the electrical operation of the SDD chip of FIG. 1.

FIG. 2 illustrates schematically the elecrical operating principle of an SDD according to FIG. 1. The dashed elliptical line illustrates, which part of the circuit diagram are located directly within the detector chip. An X-ray photon that hits the detector generates a cloud of free charge carriers, the size of the cloud—and correspondingly the total electric charge it contains—being dependent on the incident energy of the photon. The internal electric field of the detector causes the free charge carriers to drift towards the anode and cathode electrodes. The electric charge represented by the electrons arriving at the anode A can be thought of as a current pulse iq. The detector capacitance acts as an integrator that collects the current pulses and integrates them into an accumulating voltage. Said detector capacitance consists mainly of the anode capacitance Ca, but necessitates also considering the stray capacitances of the FET. The last-mentioned are illustrated as Cdg and Cgs in FIG. 2. Since the circuit arrangement makes the FET operate as a source follower (meaning that the gate-to-source voltage Vgs remains constant), only the drain-to-gate capacitance Cdg makes a true contribution to the detector capacitance Cdet:

$$Cdet = Ca + Cdg \quad (1)$$

Assuming that the charge collected at the anode as a consequence of the hit of a single X-ray photon was q0, we may write the expression for a change ΔVs in the potential Vs:

$$\Delta Vs = q0/Cdet = q0/(Ca+Cdg) \quad (2)$$

which may be expressed in other words so that the charge-to-voltage conversion factor of the detector is $(Ca+Cdg)^{-1}$.

In the absence of any charge neutralization mechanisms the detector would quickly saturate as collected charge builds up on the anode. Continuous operation is made possible by a leakage current $I_L$, which occurs in the channel of the FET as a consequence of so-called impact ionization and acts to neutralize the accumulating charge. A description of various mechanisms related to the generation of the leakage current $I_L$ is found in the publication E. Elad: "Drain Feedback—a Novel Feedback Technique for Low-Noise Cryogenic Preamplifiers", IEEE Trans. on Nucl. Sci., NS-19, No. 1, 1972, pp. 403–411. The ionization rate, which is a major factor controlling the flow of the leakage current $I_L$, depends strongly on the voltage Vdg across the drain-gate junction of the FET. We may deduce that the value of the leakage current $I_L$ depends at least partly on the drain-source voltage Vds of the FET in the SDD.

Under constant illumination by X-rays the repeatedly occurring radiation-induced current pulses to the anode draw the anode potential into the negative direction as long as steady state conditions are reached, under which the leakage current $I_L$ becomes equal to the radiation-induced current. As we noted above, Vgs stays constant due to the source follower property of the circuit, so the change in the anode potential can be directly observed as a change in Vds. A detector appliance utilizing the detector described above with reference to FIGS. 1 and 2 comprises a voltage-sensitive measurement arrangement (not shown in FIG. 2) adapted to measure changes in the potential designated as Vs. Since the relative magnitude of the leakage current $I_L$ compared to the total current through the FET is negligible, it has become customary to designate the constant current drawn from the source of the FET to a fixed negative potential as Id even if literally taken a more appropriate designation could be Is.

A problem of conventional SDD-based detector appliances is the rate dependent shift in peak positions. When the rate at which X-ray photons hit the detector increases, also the voltage Vds increases. This would not be a problem as such, but becomes one because the detector capacitance is not constant but depends on voltages within the detector chip. A change in the detector capacitance Cdet means a change in the charge-to-voltage conversion factor of the detector. In a measured X-ray spectrum a peak representing radiation at a certain constant energy will shift to different locations depending on whether X-ray photons of that energy arrived at a slower or a faster rate. Whether the shift is upwards or downwards depends on the mutual order of relevance of the capacitances Ca and Cdg, because these have oppositely directed dependencies on the photon hit rate.

Figure 3:
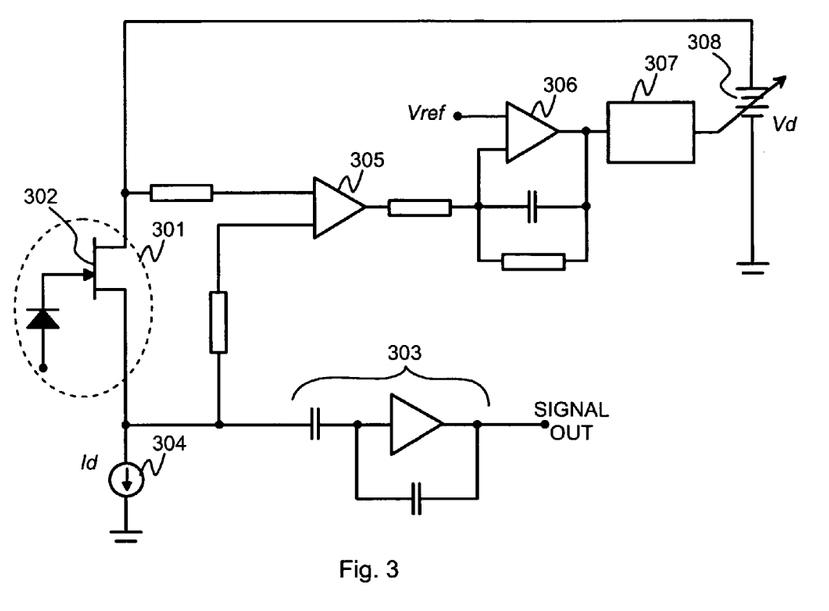
FIG. 3 illustrates a way of compensating for the rate dependent change in the charge-to-voltage conversion factor.

Since the change in the charge-to-voltage conversion factor is essentially a consequence of a change in the voltage Vdg, a person skilled in the art might consider compensating for it by changing the drain potential Vd as a function of momentary photon hit rate. FIG. 3 illustrates a possible solution following this approach. A drift-type detector chip 301 comprises a FET 302, the source of which is coupled to a signal output through a preamplifier coupling 303. There is also a current generator 304 adapted to draw a constant current through the FET; as noted above, since this current is essentially the same as the drain current, it is conventional to designate the current drawn by the current generator 304 as the drain current Id, although the coupling is to the source electrode of the FET.

A differential amplifier 305 is coupled to measure the drain-to-source voltage Vds across the FET 302 and to give an output proportional thereto. A controlling amplifier 306 is adapted to compare the output of the differential amplifier 305 to a fixed reference voltage Vref and to use the comparison result to change the voltage produced by a controllable voltage source 308. The amplification and polarity of the controlling amplifier 306 have been carefully tuned so that the resulting change in Vd compensates for the rate-induced change in the charge-to-voltage conversion factor. Since the change of the charge-to-voltage conversion factor is nonlinear, a linearization circuit 307 is needed between the controlling amplifier 306 and the controllable voltage source 308.

The circuit of FIG. 3 involves problems that mainly relate to its susceptibility to oscillations. The most critical part is the differential amplifier 305, the input of which must be very well balanced on the operational frequencies of the control loop. It may also prove to be difficult to realize the linearization circuit 307, because of the complexity of the nonlinear behaviour of the charge-to-voltage conversion factor. The circuit may also be somewhat slow to react to changes in the photon hit rate.

SUMMARY OF THE INVENTION

An objective of the present invention is to compensate for the rate dependent change of charge-to-voltage conversion factor in a drift-type radiation detector. Especially an objective of the invention is to realize such compensation in a manner that is simple to implement and realiable in operation. Additionally an objective of the invention is to provide a detector appliance that is adapted to compensate for rate dependent shift of the peak positions resulting from said .

The objectives of the invention are achieved by changing the drain current as a function of momentary photon rate.

A circuit arrangement according to the invention is characterised in that it comprises:
  an information collection circuit adapted to collect information about a momentary photon hit rate affecting said drift-type radiation detector,
  a control signal generation circuit coupled to an output of said information collection circuit and adapted to generate a control signal indicative of said momentary photon hit rate and
  a controllable current generator adapted to respond to said control signal by causing a drain current of controllable magnitude to flow through an integrated amplifier of said drift-type radiation detector, said controllable magnitude of said drain current being dependent on the value of said control signal.

The invention applies also to a detector appliance, which is characterised in that it comprises:
  a drift-type radiation detector with an integrated amplifier,
  a current generator adapted to cause a drain current to flow through said integrated amplifier,
  a rate dependent information collecting circuit element adapted to produce an output indicative of a momentary photon hit rate affecting said drift-type radiation detector, and
  a coupling from said rate dependent information collecting circuit element to said current generator;

wherein said current generator is responsive to a control signal received through said coupling by controllably changing the magnitude of said drain current.

Additionally the invention applies to a method for compensating for the rate dependent change of charge-to-voltage conversion factor in a drift-type radiation detector. The method is characterised in that it comprises:
  detecting a change in a momentary photon hit rate affecting said drift-type radiation detector, and
  changing a drain current flowing through an integrated amplifier of said drift-type radiation detector by an amount proportional to the detected change in said momentary photon hit rate.

It can be shown that the leakage current that takes care of charge neutralization in a drift type detector is a linear function of the drain current. According to the invention a controllable current generator (current source or current sink; more generally: a controllable circuit member adapted to cause a current of predefined magnitude to flow in response to a control signal) is used to controllably change the drain current as a function of photon hit rate, or as a function of the drain-to-source voltage of the FET in the detector chip, which as such is a function of the photon hit rate.

The novel features which are considered as characteristic of the invention are set forth in particular in the appended claims. The invention itself, however, both as to its construction and its method of operation, together with additional objects and advantages thereof, will be best understood from the following description of specific embodiments when read in connection with the accompanying drawings.

The exemplary embodiments of the invention presented in this patent application are not to be interpreted to pose limitations to the applicability of the appended claims. The verb "to comprise" is used in this patent application as an open limitation that does not exclude the existence of also unrecited features. The features recited in depending claims are mutually freely combinable unless otherwise explicitly stated.

DETAILED DESCRIPTION OF THE INVENTION

From the scientific publication of E. Elad mentioned above we may draw an expression for the leakage current $I_L$:

$$I_L = Id \cdot \alpha \cdot \sqrt{Vds} \cdot e^{-\frac{\beta}{\sqrt{Vds}}} \tag{3}$$

where $\alpha$ and $\beta$ are material—and temperature dependent constants. This expression is illustrative in two ways. Firstly, it confirms the statement made above about the complicated nonlinear relationship between $I_L$ and Vds, which makes it difficult to achieve satisfactory results by tampering with the value of Vds, which we attempted in FIG. 3. Secondly expression (3) shows that the dependency between $I_L$ and Id is much simpler, even linear. We may thus deduce that it is possible to compensate for a purely rate dependent distortion of $I_L$ by causing a comparable distortion to Id, so that as a result Vds assumes the value it would have without said rate dependent distortion of $I_L$.

Figure 4:
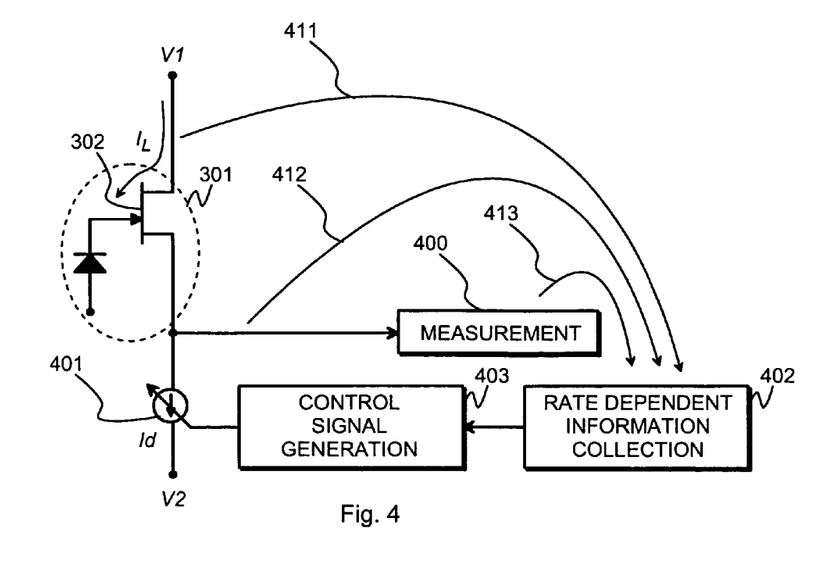
FIG. 4 illustrates a principle of controllably changing the drain current.

FIG. 4 illustrates schematically an arrangement in which a drift type detector chip 301 is used for detecting radiation. A FET 302 on the drift type detector chip 301 has its drain coupled to a first potential V1. The source of the FET 302 is coupled to a second potential V2 through a controllable current generator 401. From the source of the FET 302 there is also a connection to measurement circuitry 400, which may comprise amplifiers, pulse shaping circuits and a multichannel analyser (not separately shown in FIG. 4). According to an embodiment of the invention the arrangement of FIG. 4 comprises a circuit element 402 adapted to collect information that describes the momentary rate at which photons hit the detector chip 301. On the basis of such information the circuit element 402 produces an output signal the value of which represents a momentary value of the photon hit rate. Additionally the arrangement of FIG. 4 comprises a circuit element 403 adapted to receive said output signal and to adjust the controllable current generator 401 so that the value of Id is changed by an amount that corresponds to an estimated rate dependent change in the value of the neutralization current $I_L$.

Circuit elements 402 and 403 can be implemented using analog or digital technology, or both. A feature typical to especially analog electronics is that a component or a circuit element may have multiple functions, and that it is not always possible to clearly separate a circuit arrangement into well-defined, separate functional blocks. The division into circuit elements 402 and 403 should therefore be considered merely as an illustrative aid in understanding the operation of certain embodiments of the invention, rather than any strict requirement to be fulfilled in practical implementations.

The principle illustrated in FIG. 4 does not restrict the selection of the source of the information collected by circuit element 402, as long as the selected source is capable of delivering accurate, up-to-date information describing the momentary photon hit rate. Depending on which kinds of fixed or changing potentials are used, such information may be available from the drain side of the FET 302 according to arrow 411, from the source side of the FET 302 according to arrow 412, and/or even from the measurement circuitry 400 according to arrow 413. In the following we describe mainly the middle alternative of these in more detail.

Figure 5:
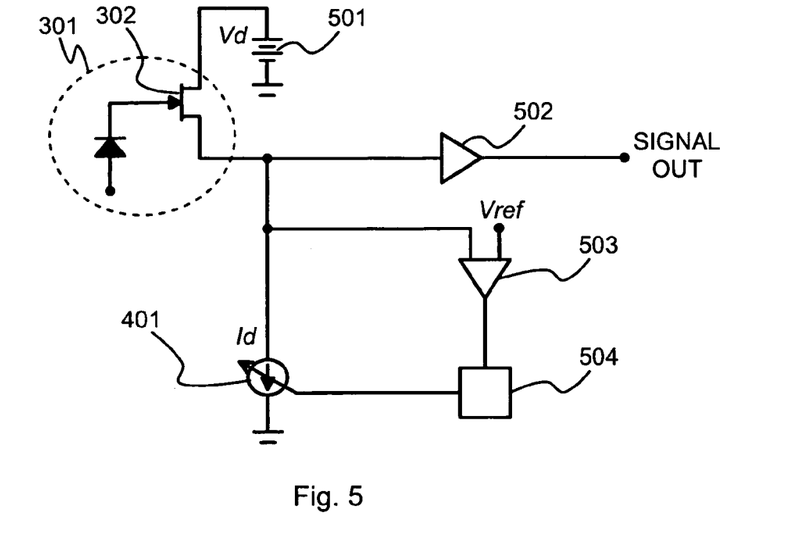
FIG. 5 illustrates a more detailed implementation of the principle of FIG. 4.

FIG. 5 is a simplified schematic diagram illustrating a circuit arrangement where an SDD chip 301 is used to detect radiation. The FET 302 of the SDD chip 301 has its drain collected to a fixed voltage source 501 adapted to deliver a fixed drain voltage Vd. The source of the FET 302 is coupled to the input of a preamplifier 502, the output of which constitutes a signal output meant to be coupled to further measurement and storage circuitry. The source of the FET 302 is likewise coupled to one input of a differential amplifier 503, the other input of which is coupled to a fixed reference voltage Vref. The output of the differential amplifier 503 is coupled to a linearization circuit 504, from which there is a coupling to a control input of a controllable current generator 401. Said controllable current generator 401 is adapted to draw a current of controllable magnitude from the source of the FET 302 to ground.

Since the value of Vd is constant, all changes of Vds of the FET 302 appear directly in the source potential, which the differential amplifier 503 compares to the reference Vref. The value of Vref has been selected so that at a certain predefined photon hit rate at the SDD chip 301 there occurs a certain desired nominal drain current Id. Lower photon hit rates cause the drain current Id to decrease, and higher photon hit rates cause the drain current Id to increase, the relative amount of decreasing and increasing being basically dependent only on the amplification factor of the differential amplifier 503.

To be quite exact, the charge-to-voltage conversion factor of the SDD chip 301 would only remain constant if the gate voltage of the FET 302 remained constant. However, changes in Id imply changes also in the gate-to-source voltage Vgs of the FET 302, which means that the source potential monitored by the differential amplifier 503 is strictly speaking not an exact indicator of the drain-to-gate voltage Vdg of the FET 302, and thus neither of the charge-to-voltage conversion factor. The task of the linearization circuit 504 is to counteract the distortion that would otherwise result from said slight discrepancy between the source potential and the drain-to-gate voltage Vdg of the FET 302. Also careful tuning of the differential amplifier 503 helps to reduce said distortion.

Simulations and measurements have shown that the control principle of FIGS. 4 and 5 is superior to that of FIG. 3 at least in achieving better stability, reacting faster to changes in photon hit rate, and enabling the use of a simpler structure concerning linearization.

Figure 6:
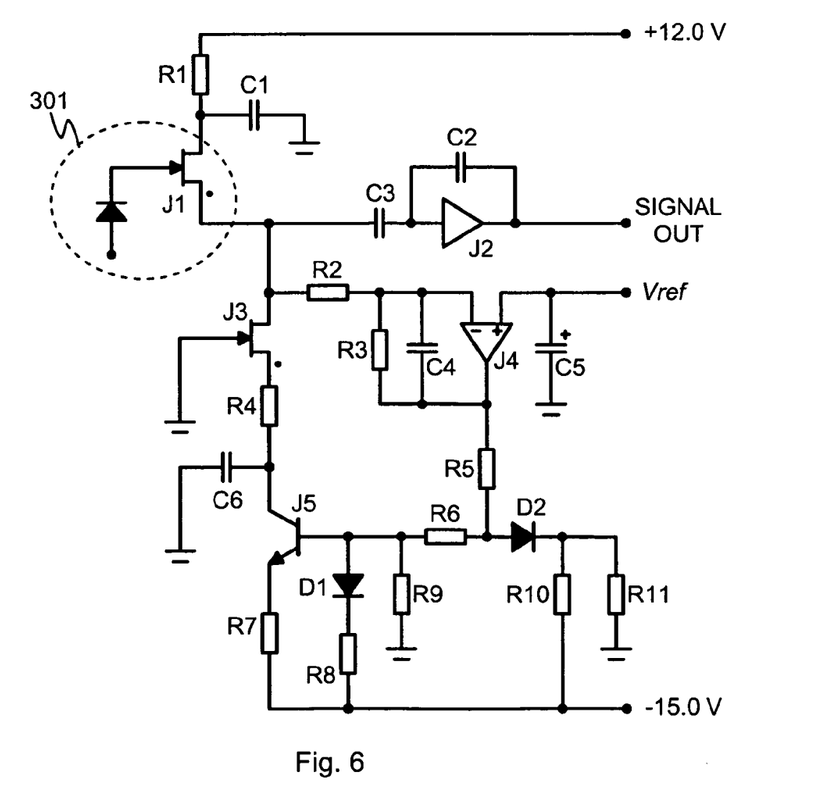
FIG. 6 illustrates a circuit arrangement according to an embodiment of the invention.

FIG. 6 illustrates an exemplary detailed implementation of a circuit arrangement according to FIG. 5. The drain of the FET J1 in the SDD chip 301 is coupled to a fixed +12V voltage through a resistor R1. Additionally there is an AC attenuator coupling from the drain of the FET J1 to ground through a capacitor C1. A coupling from the source of the FET J1 to the signal output goes through a conventional preamplifier arrangement consisting of the amplifier J2 and the associated capacitors C2 and C3. The controllable current path from the source of the FET J1 goes to the drain of another FET J3, continues from the source of said FET J3 through resistor R4 to the collector of an NPN transistor J5 and extends from the emitter of said NPN transistor J5 through resistor R7 to a fixed −15V voltage. The gate of FET J3 is coupled to ground; from the collector of the NPN transistor J5 is also coupled to ground through capacitor C6.

The monitoring differential amplifier J4 receives a sample of the source potential of the FET J1 to its negative input through resistor R2. For tuning the differential amplifier J4 there are resistor R3 and capacitor C4 coupled in parallel between its negative input and its output. The reference voltage Vref is coupled to the positive input of the differential amplifier J4. An AC attenuator capacitor C5 couples the positive input of the differential amplifier J4 to ground.

The output of the differential amplifier is coupled to the base of the NPN transistor J5 through resistors R5 and R6. The base of the NPN transistor J5 is also coupled to ground through resistor R9 and to the anode of a diode D1, from the cathode of which there is a coupling through resistor R8 to the fixed −15V voltage. The point between resistors R5 and R6 is coupled to the anode of diode D2, the cathode of which is coupled to ground through resistor R11 and to the fixed −15V voltage through resistor R10.

Some exemplary values for the components appearing in FIG. 6 are: R1=200Ω, R2=1 MΩ, R3=10 MΩ, R4=R11=24 kΩ, R5=1.8 kΩ, R6=31 kΩ, R7=1 kΩ, R9=45 kΩ, R10=65 kΩ, C1=C6=100 nF, C4=33 nF, C5=3.3 μF, J3=BF861B, J4=LF356, J5=2N3904, D1=D2=1N4148.

Figure 7:
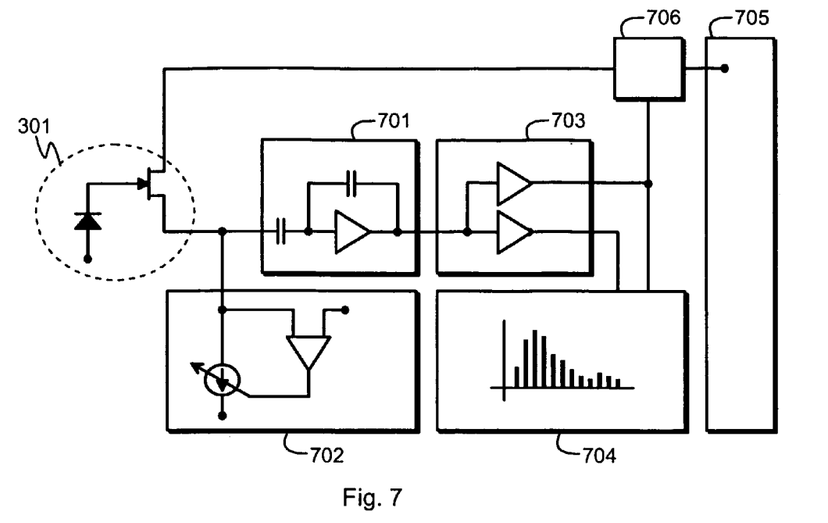
FIG. 7 illustrates a detector appliance according to the invention.

FIG. 7 illustrates a detector appliance for measuring X-ray spectra. It comprises an SDD detector chip 301, an output of which is coupled to a preamplifier 701 and a compensation circuit 702 adapted to controllably change the value of a drain current drawn through an integrated FET of the SDD detector chip 301. The couplings of the SDD detector chip 301, the preamplifier 701 and the compensation circuit 702 are e.g. similar to those described above with reference to FIG. 6. An output of the preamplifier 701 is coupled to a linear amplifier 703 comprising a measurement channel and a timing channel, each of which produces an output of its own. These outputs are coupled to a multichannel analyser 704. The detector appliance comprises also a platform functionality 705, which is adapted to produce and distribute operating voltages and to provide other kinds of support functions to the other functional blocks of the detector appliance. For the sake of maintaining graphical clarity only the provision of the drain voltage to the SDD chip 301 is explicitly shown in FIG. 7.

As an optional detail the detector appliance comprises a circuit 706 adapted to respond to the output of the timing channel in the linear amplifier by controllably altering the charge neutralising effect of the drain voltage delivered to the SDD chip 301. Said circuit 706 can be e.g. of the kind described in detail in a co-pending U.S. patent application Ser. No. 10/881,420, which is incorporated herein by reference. It should be noted, however, that the arrangement disclosed in said co-pending US patent application also inherently counteracts the rate-dependent shift in the locations of spectral peaks, so combining it with the present invention might lead to certain redundancy in correction circuitry.

Figure 8A:
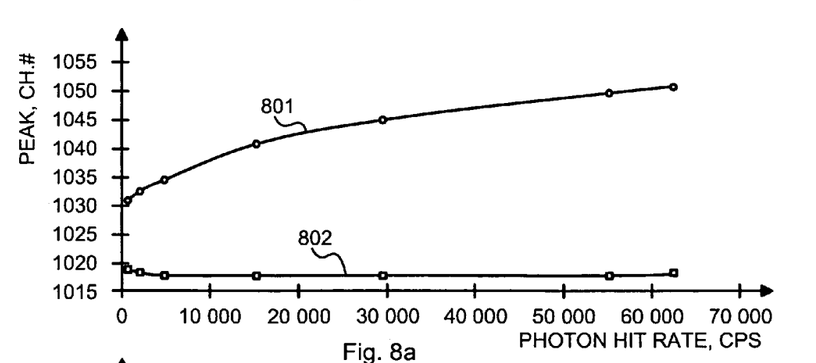
FIGS. 8a and 8b illustrate measurement results achieved with a detector appliance according to FIG. 7
Figure 8B:
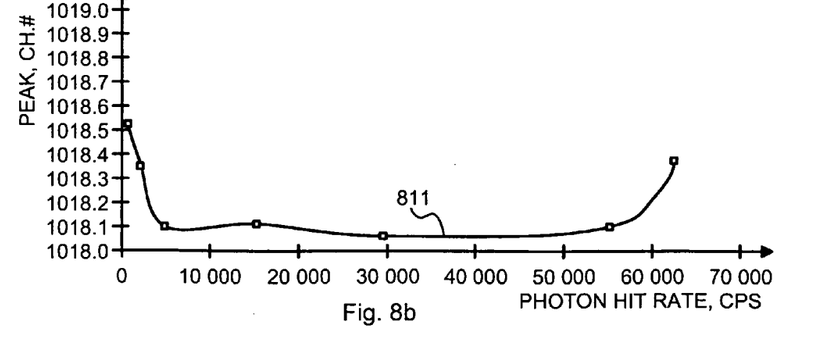

An experimental setup of the kind shown in FIG. 7, without circuit 706, was built by using an SDD chip model SD3-05-138 by PNSensor GmbH, Germany. The SDD chip was biased according to the standard instructions from its manufacturer. Detector temperature was −20.0° C., drain voltage +12.0 V, drain current at zero photon hit rate in the order of 200 μA, drain current at a photon hit rate of 63 000 cps (counts per second) in the order of 350 μA, and the radiation source was Fe-55. A linear amplifier of the type Canberra 2020 and a multichannel analyser of the type Tennelec PCA-II were used. FIGS. 8a and 8b illustrate certain measurement results. Graph 801 in FIG. 8a illustrates the observed peak position on the channels of the multichannel analyser when the compensation circuit was switched off, and the drain current was consequently constant. Graph 802 illustrates the observed peak position when the compensation circuit was in use. Graph 811 in FIG. 8b is the same as graph 802 but in a more detailed scale. It is easy to note how a change in the photon hit rate from the order of a few hundred cps to 63 000 cps caused the peak position to shift by about 20 channel numbers when the compensation was not in use, while switching on the compensation enabled keeping the peak position within one half of a channel, and even essentially constant over a major part of the tested range of photon hit rates.

Figure 9:
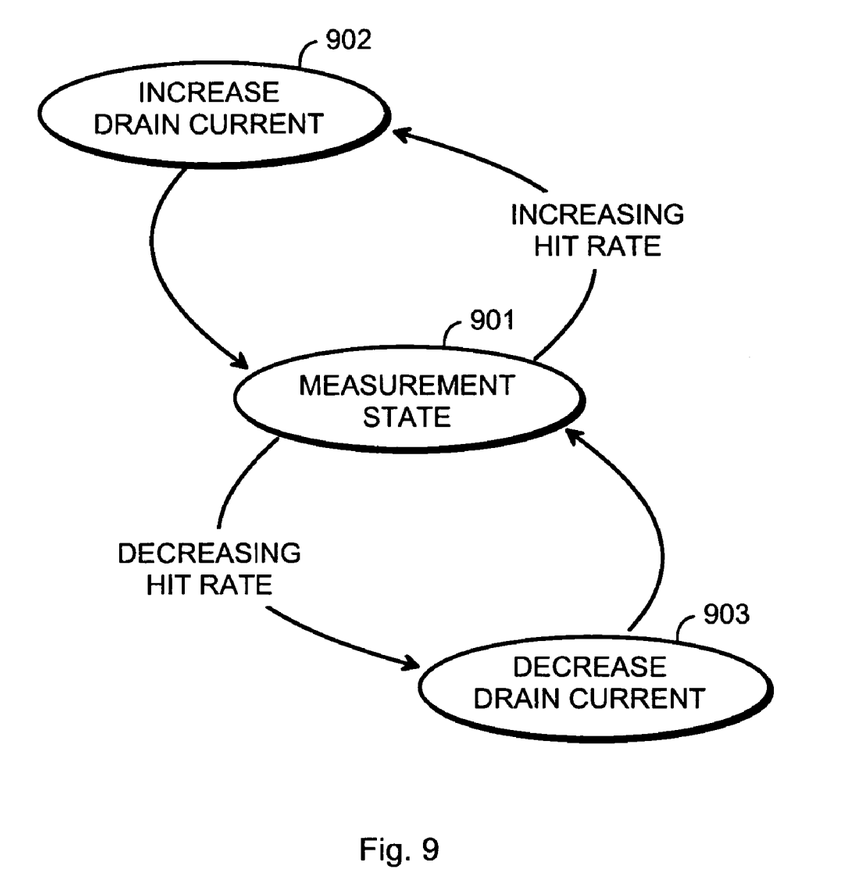
FIG. 9 illustrates a method according to an embodiment of the invention in the form of a state diagram.

FIG. 9 illustrates a method according to an embodiment in the form of a state diagram. A measurement state 901 corresponds to steady state conditions where the photon hit rate does not change and the charge-to-voltage conversion factor of the SDD detector chip and consequently the correspondence between photon energy and channel number in the multichannel analyser remains constant. If information is obtained about an increasing photon hit rate, the drain current drawn through the FET in the SDD chip is also increased in state 902 by a relative amount that is as close as possible to the increase in leakage current that was caused by the increasing photon hit rate. Correspondingly if there is obtained information about a decreasing photon hit rate, the drain current is decreased according to state 903.

The exemplary embodiments of the invention described above may be modified in various ways without departing from the scope of the appended claims. For example, even if all embodiments described so far suggest making a coupling to the compensation circuit directly from the output of the SDD chip, it may prove possible to couple the compensation circuit to receive an input from after the preamplifier. This may help to avoid problems that otherwise might arise from the additional impedance caused by the input of the compensation circuit to the output of the SDD chip, which is typically carefully designed to match the input impedance of the preamplifier only.

The invention claimed is:

1. A circuit arrangement for compensating for a rate dependent change of a charge-to-voltage conversion factor in a drift-type radiation detector, comprising:
    an information collection circuit adapted to collect information about a momentary photon hit rate affecting said drift-type radiation detector,
    a control signal generation circuit coupled to an output of said information collection circuit and adapted to generate a control signal indicative of said momentary photon hit rate and
    a controllable current generator adapted to respond to said control signal by causing a drain current of controllable magnitude to flow through an integrated amplifier of said drift-type radiation detector, said controllable magnitude of said drain current being dependent on the value of said control signal.

2. A circuit arrangement according to claim 1, wherein said information collection circuit is adapted to monitor a drain-to-source voltage in said integrated amplifier.

3. A circuit arrangement according to claim 2, wherein a drain of a field-effect transistor of said integrated amplifier is coupled to a fixed potential, and said information collection circuit comprises a comparator having an output and adapted to compare a source potential of said field-effect transistor to a reference and to deliver an output signal at said output, the magnitude of said output signal being proportional to the absolute difference between said source potential and said reference.

4. A circuit arrangement according to claim 3, additionally comprising a linearizing circuit between said output of said comparator and said controllable current generator.

5. A detector appliance for measuring X-ray spectra, comprising:
  a drift-type radiation detector with an integrated amplifier,
  a current generator adapted to cause a drain current to flow through said integrated amplifier,
  a rate dependent information collecting circuit element adapted to produce an output indicative of a momentary photon hit rate affecting said drift-type radiation detector, and
  a coupling from said rate dependent information collecting circuit element to said current generator;
wherein said current generator is controllable and responsive to a control signal received through said coupling by controllably changing the magnitude of said drain current.

6. A detector appliance according to claim 5, additionally comprising a preamplifier coupled to receive and amplify a source potential obtained from said integrated amplifier, wherein said rate dependent information collecting circuit is coupled to receive said source potential as information indicative of a momentary photon hit rate affecting said drift-type radiation detector.

7. A detector appliance according to claim 6, additionally comprising a series coupling of a linear amplifier and a multichannel analyser coupled to an output of said preamplifier, wherein the rate dependent information collecting circuit element, the current generator and the coupling coupling from said rate dependent information collecting circuit element to said current generator together are adapted to compensate for rate dependent shift in peak positions in said multichannel analyser.

8. A detector appliance according to claim 5, wherein said integrated amplifier is a field effect transistor comprising a drain electrode, a source electrode and a gate electrode, and said current generator is coupled between the source electrode of said field effect transistor and a fixed potential.

9. A detector appliance according to claim 8, wherein said rate dependent information collecting circuit element has a first input coupled to the source electrode of said field effect transistor and a second input coupled to a reference potential, and said rate dependent information collecting circuit element is adapted to measure a potential difference between the source electrode of said field effect transistor and said reference potential, which potential difference constitutes said information indicative of a momentary photon hit rate affecting said drift-type radiation detector.

10. A method for compensating for the rate dependent change of charge-to-voltage conversion factor in a drift-type radiation detector, comprising:
  detecting a change in a momentary photon hit rate affecting said drift-type radiation detector, and
  changing a drain current flowing through an integrated amplifier of said drift-type radiation detector by an amount proportional to the detected change in said momentary photon hit rate.

11. A method according to claim 10, wherein detecting a change in said momentary photon hit rate comprises detecting a change in a source potential of said integrated amplifier.

* * * * *